(12) United States Patent
Papasouliotis et al.

(10) Patent No.: US 7,122,485 B1
(45) Date of Patent: Oct. 17, 2006

(54) DEPOSITION PROFILE MODIFICATION THROUGH PROCESS CHEMISTRY

(75) Inventors: George D. Papasouliotis, Cupertino, CA (US); Edith Goldner, Sunnyvale, CA (US); Vishal Gauri, San Jose, CA (US); Md Sazzadur Rahman, South Field, MI (US); Vikram Singh, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/316,987

(22) Filed: Dec. 9, 2002

(51) Int. Cl.
*H01L 21/31* (2006.01)

(52) U.S. Cl. ............... 438/778; 438/788

(58) Field of Classification Search ........... 438/778, 438/787–790; 427/255.37, 579, 585
See application file for complete search history.

(56) References Cited

U.S. PATENT DOCUMENTS

| | | | |
|---|---|---|---|
| 4,361,461 A | 11/1982 | Chang | |
| 5,129,958 A | 7/1992 | Nagashima et al. | |
| 5,227,191 A | 7/1993 | Nagashima | |
| 5,246,885 A | 9/1993 | Braren et al. | |
| 5,252,178 A | 10/1993 | Moslehi | |
| 5,270,264 A | 12/1993 | Andideh et al. | |
| 5,282,925 A | 2/1994 | Jeng et al. | |
| 5,342,801 A | 8/1994 | Perry et al. | |
| 5,385,857 A | 1/1995 | Solo de Zaldivar | |
| 5,494,854 A | 2/1996 | Jain | |
| 5,516,729 A | 5/1996 | Dawson et al. | |
| 5,532,516 A | 7/1996 | Pasch et al. | |
| 5,621,241 A | 4/1997 | Jain | |
| 5,622,894 A | 4/1997 | Jang et al. | |
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havermann | |
| 5,834,068 A | 11/1998 | Chern et al. | |
| 5,851,344 A | 12/1998 | Xu et al. | |
| 5,858,876 A | 1/1999 | Chew | |
| 5,869,902 A | 2/1999 | Lee et al. | |
| 5,872,058 A | 2/1999 | Van Cleemput et al. | |

(Continued)

FOREIGN PATENT DOCUMENTS

JP 2003-031649 1/2003

OTHER PUBLICATIONS

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

(Continued)

*Primary Examiner*—Mary Wilczewski
*Assistant Examiner*—Toniae M. Thomas
(74) *Attorney, Agent, or Firm*—Beyer Weaver & Thomas LLP.

(57) ABSTRACT

Disclosed are methods for modifying the topography of HDP CVD films by modifying the composition of the reactive mixture. The methods allow for deposition profile control independent of film deposition rate. They rely on changes in the process chemistry of the HDP CVD system, rather than hardware modifications, to modify the local deposition rates on the wafer. The invention provides methods of modifying the film profile by altering the composition of the reactive gas mixture, in particular the hydrogen content. In this manner, deposition profile and wiw uniformity are decoupled from deposition rate, and can be controlled without hardware modifications.

46 Claims, 10 Drawing Sheets

U.S. PATENT DOCUMENTS

| | | | |
|---|---|---|---|
| 5,897,370 A | 4/1999 | Joshi et al. | |
| 5,910,020 A | 6/1999 | Yamada | |
| 5,911,113 A | 6/1999 | Yao et al. | |
| 5,913,140 A | 6/1999 | Roche et al. | |
| 5,920,792 A | 7/1999 | Lin | |
| 5,937,323 A | 8/1999 | Orczyk et al. | |
| 5,953,635 A | 9/1999 | Andideh | |
| 5,962,923 A | 10/1999 | Xu et al. | |
| 5,963,840 A | 10/1999 | Xia et al. | |
| 5,968,610 A | 10/1999 | Liu et al. | |
| 5,972,192 A | 10/1999 | Dubin et al. | |
| 6,027,663 A | 2/2000 | Martin et al. | |
| 6,030,881 A | 2/2000 | Papasouliotis et al. | |
| 6,077,451 A | 6/2000 | Takenaka et al. | |
| 6,077,574 A * | 6/2000 | Usami | 427/579 |
| 6,106,678 A | 8/2000 | Shufflebotham et al. | |
| 6,124,211 A | 9/2000 | Butterbaugh et al. | |
| 6,136,703 A | 10/2000 | Vaartstra | |
| 6,149,779 A | 11/2000 | Van Cleemput | |
| 6,184,158 B1 | 2/2001 | Shufflebotham et al. | |
| 6,200,412 B1 | 3/2001 | Kilgore et al. | |
| 6,211,065 B1 | 4/2001 | Xi et al. | |
| 6,232,196 B1 | 5/2001 | Raaijmakers et al. | |
| 6,265,269 B1 | 7/2001 | Chen et al. | |
| 6,277,764 B1 | 8/2001 | Shin et al. | |
| 6,331,494 B1 | 12/2001 | Olson et al. | |
| 6,335,261 B1 | 1/2002 | Natzle et al. | |
| 6,395,150 B1 * | 5/2002 | Van Cleemput et al. | 204/192.37 |
| 6,400,023 B1 | 6/2002 | Huang | |
| 6,410,446 B1 | 6/2002 | Tsai et al. | |
| 6,479,361 B1 | 11/2002 | Park | |
| 6,479,396 B1 | 11/2002 | Xu et al. | |
| 6,486,081 B1 | 11/2002 | Ishikawa et al. | |
| 6,500,728 B1 | 12/2002 | Wang | |
| 6,531,377 B1 | 3/2003 | Knorr et al. | |
| 6,566,229 B1 | 5/2003 | Hong et al. | |
| 6,569,777 B1 | 5/2003 | Hsu et al. | |
| 6,596,653 B1 | 7/2003 | Tan et al. | |
| 6,596,654 B1 * | 7/2003 | Bayman et al. | 438/788 |
| 6,599,829 B1 | 7/2003 | Smith et al. | |
| 6,617,207 B1 | 9/2003 | Kiryu et al. | |
| 6,642,105 B1 | 11/2003 | Kim et al. | |
| 6,706,541 B1 | 3/2004 | Toprac et al. | |
| 6,737,334 B1 | 5/2004 | Ho et al. | |
| 6,787,483 B1 | 9/2004 | Bayman et al. | |
| 6,794,290 B1 | 9/2004 | Papasouliotis et al. | |
| 6,808,748 B1 * | 10/2004 | Kapoor et al. | 427/255.31 |
| 6,812,043 B1 | 11/2004 | Bao et al. | |
| 6,821,905 B1 | 11/2004 | Pan et al. | |
| 6,846,391 B1 | 1/2005 | Papasouliotis et al. | |
| 6,846,745 B1 | 1/2005 | Papasouliotis et al. | |
| 6,867,086 B1 | 3/2005 | Chen et al. | |
| 6,958,112 B1 | 10/2005 | Karim et al. | |
| 2001/0019903 A1 | 9/2001 | Shufflebotham et al. | |
| 2001/0044203 A1 | 11/2001 | Huang et al. | |
| 2002/0052119 A1 | 5/2002 | Van Cleemput | |
| 2002/0084257 A1 * | 7/2002 | Bjorkman et al. | 216/72 |
| 2002/0179570 A1 | 12/2002 | Mathad et al. | |
| 2003/0003244 A1 | 1/2003 | Rossman | |
| 2003/0003682 A1 | 1/2003 | Moll et al. | |
| 2003/0087506 A1 | 5/2003 | Kirchhoff | |
| 2003/0165632 A1 | 9/2003 | Lin et al. | |
| 2003/0203652 A1 | 10/2003 | Bao et al. | |
| 2003/0207580 A1 | 11/2003 | Li et al. | |
| 2004/0058549 A1 | 3/2004 | Ho et al. | |
| 2004/0082181 A1 | 4/2004 | Doan et al. | |
| 2004/0110390 A1 | 6/2004 | Takagi et al. | |
| 2004/0241342 A1 * | 12/2004 | Karim et al. | 427/585 |
| 2005/0074946 A1 | 4/2005 | Chu et al. | |
| 2005/0130411 A1 | 6/2005 | Bao et al. | |
| 2005/0250346 A1 | 11/2005 | Schmitt | |

OTHER PUBLICATIONS

Lang et al., "Strain Engineering—HDP Thin Film With Tensile Stress For FEOL and Other Applications", Novellus Systems, Inc., filed Nov. 17, 2004, U.S. Appl. No. 10/991,890, pp. 1-35.

Lang et al., "Using Water (H20) To Replace Oxygen (02) In A Silicon Dioxide (Si02) Thin Film Deposition Process for HDP STI Technology", Novellus Systems, Inc., filed Nov. 9, 2005, U.S. Appl. No. 11/272,487, pp. 1-25.

Papasouliotis et al., "Hydrogen-Based Phosphosilicate Glass Process for Gap Fill of High Aspect Ratio Structures", Novellus Systems, Inc., filed Oct. 11, 2002, U.S. Appl. No. 10/271,333, pp. 1-28.

Guari et al., "Method of Preventing Structures Erosion During Multi-Step Gap Fill", Novellus Systems, Inc., filed Dec. 4, 2003, U.S. Appl. No. 10/728,569, pp. 1-29.

Bayman et al., "Gap Fill For High Aspect Ratio Structures", Novellus Systems, Inc., filed Jul. 13, 2004, U.S. Appl. No. 10/890,655, pp. 1-24.

Sutanto et al., "Method For Controlling Etch Process Repeatability", Novellus Systems, Inc., filed Sep. 2, 2003, U.S. Appl. No. 10/654,113, pp. 1-31.

Bayman et al., "Process Modulation to Prevent Structure Erosion During Gap Fill", Novellus Systems, Inc., filed Sep. 7, 2004, U.S. Appl. No. 10/935,909, pp. 1-30.

Papasouliotis et al., "Dynamic Modification of Gap-Fill Process Characteristics", Novellus Systems, Inc., filed Sep. 21, 2004, U.S. Appl. No. 10/947,424, pp. 1-25.

Hook et al., "The Effects of Fluorine on Parametrics and Reliability in a 0.18-μm 3.5/6.8 nm Dual Gate Oxide CMOS Technology", IEEE Transactions on Electron Devices, vol. 48, No. 7., Jul. 2001, pp. 1346-1353.

Shanker et al., "Hydrogen Treatment Enhanced Gap Fill", Novellus Systems, Inc., filed Mar. 16, 2005, U.S. Appl. No. 11/082,369, pp. 1-33.

Zhu et al., "Biased $H_2$ Etch Process In Deposition-Etch-Deposition Gap Fill", Novellus Systems, Inc., filed Dec. 10, 2003, U.S. Appl. No. 10/733,858, pp. 1-28.

Lang et al., "Helium-Based Etch Process in Deposition-Etch-Deposition Gap Fill", Novellus Systems, Inc., filed Jun. 22, 2005, U.S. Appl. No. 11/159,834, pp. 1-29.

* cited by examiner

FIG. 1C

H₂ 50% /He 50% stack
wiw uniformity < 2% 1σ

FIG. 1B

He chemistry
11.7% 1σ wiw uniformity
Center thin profile

FIG. 1A

H₂ chemistry
9.8% 1σ wiw uniformity
Center thick profile

FIG. 4C 300 sccm

FIG. 4B 200 sccm

FIG. 4A H2 = 100 sccm

FIG. 4G 1000 sccm

FIG. 4F 800 sccm

FIG. 4E 600 sccm

FIG. 4D H2 = 400 sccm

Layer 1 Thickness

Mean : 3511.41 A   Std Dev : 45.40 A (1.29 %)
Min : 3367.43 A   Max : 3563.61 A   Range : 196.18 A
Center pos : (0.000, 0.000) mm   Size : 194.000 mm
Contour interval : 17.56 A (0.500 %)

FIG. 10B

DEPOSITION PROFILE MODIFICATION THROUGH PROCESS CHEMISTRY

BACKGROUND OF THE INVENTION

This invention relates to electronic device fabrication processes and associated apparatus. More specifically, the invention relates to chemical vapor deposition processes for controlling the deposition profile of dielectric layers on semiconductor substrates.

It is often necessary in semiconductor processing to deposit layers of dielectric. For example, blanket layers of dielectric are deposited and patterned to provide electrical isolation between vertical layers of semiconductor or conductor (e.g., metalization) in semiconductor devices (e.g., inter-layer dielectric (ILD) or inter-metal dielectric (IMD), as sacrificial protection layers during semiconductor processing, and to fill trenches to electrically isolate adjacent regions in a semiconductor device (e.g., shallow trench isolation (STI).

In these semiconductor processing techniques, it is often necessary to control the deposition profile of dielectric material on the wafer. Depending on the application, the objective may be control (minimization) of within wafer (wiw) uniformity, deposition of a profile compatible with a subsequent processing technique (e.g., CMP), or high aspect ratio gap fill.

Dielectric deposition processes for semiconductor fabrication applications are well known. For example, TEOS/ozone SACVD (sub atmospheric chemical vapor deposition) has generally provided good results. However, such processes are expiring due to incompatibility with the advanced device constraint of a maximum thermal budget of 700° C.

Going forward, the deposition of silicon dioxide assisted by high density plasma chemical vapor deposition (HDP CVD)—a directional (bottom-up) CVD process—is the method of choice for dielectric deposition, including blanket deposition and high aspect ratio gap-fill.

The deposition profile of HDP CVD deposited dielectrics is essentially dictated by the flow rates of reactant gases (e.g., silane and oxygen), the source power set-point, and the hardware configuration. Therefore, it has often been necessary to modify hardware settings in order to optimize film properties as processes evolve in order to meet requirements of future device generations.

To improve fabrication of advanced technology devices, the art requires better dielectric deposition processes that provide deposition profile control without the need for costly and time consuming hardware modifications.

SUMMARY OF THE INVENTION

This present invention addresses that need by providing methods for modifying the topography of HDP CVD films by modifying the composition of the reactive mixture. The methods allow for deposition profile control independent of film deposition rate. They rely on changes in the process chemistry of the HDP CVD system, rather than hardware modifications, to modify the local deposition rates on the wafer. The invention provides methods of modifying the film profile by altering the composition of the reactive gas mixture, in particular the hydrogen content. In this manner, deposition profile and wiw uniformity are decoupled from deposition rate, and can be controlled without hardware modifications.

In general, the invention involves sequentially introducing into a high density plasma chemical vapor deposition reactor chamber a plurality of process gases having different hydrogen compositions. A bias is applied to a substrate, generally a semiconductor substrate, in the reactor chamber causing a dielectric film to grow on the substrate via high density plasma chemical vapor deposition. The hydrogen content of the process gases exerts a strong effect on local dielectric deposition rates. By manipulating the hydrogen content of process gases in the HDP CVD reaction chamber the deposition profile of the deposited dielectric film may be controlled and tailored for particular purposes.

The invention is described below in terms of several specific embodiments, each of which involves a composite process involving HDP CVD dielectric deposition using a process gases of varying hydrogen composition. In each case, the hydrogen content of the process gases used is manipulated such that the deposited dielectric has a desired profile or deposition characteristic. A first embodiment involves a composite process involving at least two discrete sequential deposition stages. For example, the process gas chemistry may be altered during deposition to produce two or more layers of complementary profile that when superposed by sequential deposition yields a dielectric layer of optimum film uniformity (across the wafer). Alternatively, the hydrogen content of process gases in the reaction chamber, and the resulting dielectric film profile, may be changed gradually rather than in discrete stages. Either of these approaches may also be employed to generate other desired deposition profiles or characteristics, for example a center thick profile to counter the dishing effect where the wafer is to undergo subsequent CMP processing, or a deposition characteristic advantageous for high aspect ratio gap-fill applications.

In one aspect, the invention relates to a method of depositing a dielectric film on a semiconductor substrate. The method involves providing a substrate in a process chamber of a high density plasma chemical vapor deposition reactor, sequentially introducing into the process chamber a plurality of process gases comprising different hydrogen compositions, and applying a bias to the substrate, to thereby grow a dielectric film via high density plasma chemical vapor deposition on the semiconductor substrate. The deposition profile of the deposited dielectric film may be controlled by varying the hydrogen content of the process gasses.

The detailed description below will further discuss the benefits and features of this invention.

DETAILED DESCRIPTION OF THE INVENTION

Introduction

The present invention relates to methods for modifying the topography of HDP CVD films by modifying the composition of the reactive mixture. The methods allow for deposition profile control independent of film deposition rate. They rely on changes in the process chemistry of the HDP CVD system, rather than hardware modifications, to modify the local deposition rates on the wafer. The invention provides methods of modifying the film profile by altering the composition of the reactive gas mixture, in particular the hydrogen content. In this manner, deposition profile and wiw uniformity are decoupled from deposition rate, and can be controlled without hardware modifications.

In general, the invention involves sequentially introducing into a high density plasma chemical vapor deposition reactor chamber a plurality of process gases having different hydrogen compositions. A bias is applied to a substrate, generally a semiconductor substrate, in the reactor chamber causing a dielectric film to grow on the substrate via high density plasma chemical vapor deposition. The hydrogen content of the process gases exerts a strong effect on local dielectric deposition rates. In general, a hydrogen-based process gas will produce an HDP CVD deposited film with greater center thickness than a helium-based process gas. As described in more detail below, for a typical chamber configuration, films formed using process gases with no or low hydrogen content will have a center thin profile, while films from process gases with higher hydrogen content typically have a center thick profile. By manipulating the hydrogen content of process gases in the HDP CVD reaction chamber the deposition profile of the deposited dielectric film may be controlled between the two extremes and tailored for particular purposes.

The invention is described below in terms of several specific embodiments, each of which involves a composite process involving HDP CVD dielectric deposition using a process gases of varying hydrogen composition. In each case, the hydrogen content of the process gases used is manipulated such that the deposited dielectric has a desired profile or deposition characteristic. A first embodiment involves a composite process involving at least two discrete sequential deposition stages. For example, the process gas chemistry may be altered during deposition to produce two or more layers of complementary profile which, when superposed by sequential deposition, yield a dielectric layer of optimum wiw uniformity. Alternatively, the hydrogen content of process gases in the reaction chamber, and the resulting dielectric film profile, may be changed gradually (continually) rather than in discrete stages. Either of these approaches may also be employed to generate other desired deposition profiles or characteristics, for example a center thick profile where the wafer is to undergo subsequent CMP processing, or a deposition characteristic advantageous for high aspect ratio gap-fill applications.

Deposition Profile Modification Through Chemistry

As indicated, this invention pertains to improved high density plasma (HDP) chemical vapor deposition (CVD) processes. Generally, a high density plasma is any plasma having electron density of $5 \times 10^9$ electrons per cubic centimeter. Typically, though not necessarily, high density plasma reactors operate at relatively low pressures, in the range of 100 mTorr or lower.

The deposition of dielectric films in high density plasma reactors proceeds through numerous reaction steps, which include the homogeneous decomposition of source gases. Typically, silane and/or other hydrogen containing species are used as deposition precursors, and the products of their homogeneous decomposition include hydrogen. Therefore, adding hydrogen to the gas mixture affects (inhibits) the decomposition rate in the gas phase, and as a result, modifies the distribution of deposition rate on the wafer and on the surfaces of the HDP reactor as whole.

As a result, the deposition profiles of films deposited using an excess of hydrogen flow are distinctly different form those deposited using an inert material (e.g., Ar/He) as a carrier gas. Note that this invention is not limited to any particular mechanism of action in which the hydrogen participates. This deposition profile difference attributable to hydrogen content in the process gas is illustrated by deposition maps in FIGS. 1A–C. The maps bear contour lines indicating the deposition profile. The + and − signs indicate greater and less than average thickness, respectively.

Figures 1A, 1B, 1C, 2:
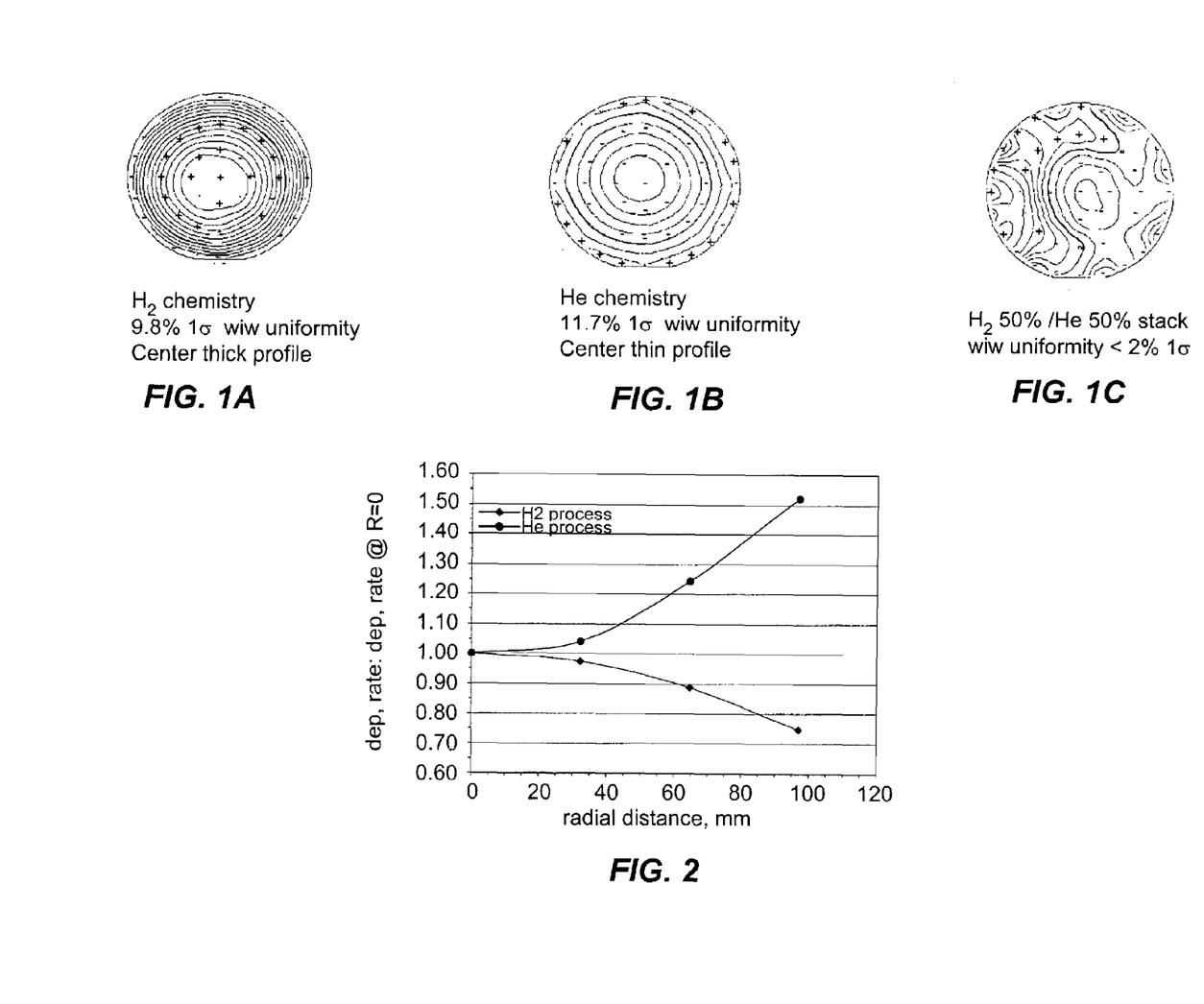
FIGS. 1A–C depict deposition maps showing the deposition profile difference attributable to hydrogen content in HDP CVD process gases.
FIG. 2 is a graph of deposition rate vs. radial distance from the wafer center showing radial scan data for film deposited on a semiconductor wafer.

FIG. 1A shows the deposition profile of a film deposited using a hydrogen-based chemistry and deposition conditions, as follows:

| | |
|---|---|
| $SiH_4$ | 45 sccm |
| $O_2$ | 65 sccm |
| Ar | 0 sccm |
| He | 0 sccm |
| $H_2$ | 1000 sccm |
| LF Power | 3000 Watts |
| HF Power | 3000 Watts |

This hydrogen chemistry produces a film on a semiconductor wafer that is thicker in the center than it is at the edge, referred to as a "center thick" profile. In this instance, the profile has a center thick wiw uniformity of 9.8% 1σ.

FIG. 1B shows the deposition profile of a film deposited using a helium-based chemistry and deposition conditions, as follows:

| | |
|---|---|
| $SiH_4$ | 40 sccm |
| $O_2$ | 52 sccm |
| Ar | 0 sccm |
| He | 300 sccm |
| $H_2$ | 0 sccm |
| LF Power | 3000 Watts |
| HF Power | 1000 Watts |

This helium chemistry produces a film on a semiconductor wafer that is thinner in the center than it is at the edge, referred to as a "center thin" profile. In this instance, the profile has a center thin wiw uniformity of 11.7% 1σ.

FIG. 1C shows the deposition profile of a film deposited using a combination of the hydrogen- and helium-based chemistries described above in accordance with the present invention, with half the about film thickness formed from each process gas. The composite film produced by the combined hydrogen/helium chemistry has a wiw uniformity of <2% 1σ, about five times lower than that of its individual components.

FIG. 2 is a graph of deposition rate vs. radial distance from the wafer center showing radial scan data for film deposited on a semiconductor wafer. The plotted data demonstrates the complementary nature of the hydrogen-based chemistry (H2 process) and helium-based chemistry (He process) profiles depicted in FIGS. 1A and 1B, respectively.

This complementarity is independent of deposition rate and holds even for processes of deposition rate below 2000 Å/min. Typically, as deposition rate decreases (with decreasing silane and oxygen in the mixture) the profile becomes increasingly center-thin and wiw uniformity deteriorates. The use of low deposition rate processes has increased over time for high aspect ratio gap-fill applications. Film uniformity in HPD CVD reactors (e.g., Novellus SPEED, Novellus Systems, Inc., San Jose, Calif.) cannot be controlled independently of deposition rate when only He (or other inert carrier, such as Ar) chemistry is used. Thus, the present invention enhances low rate deposition processes.

Figure 3:
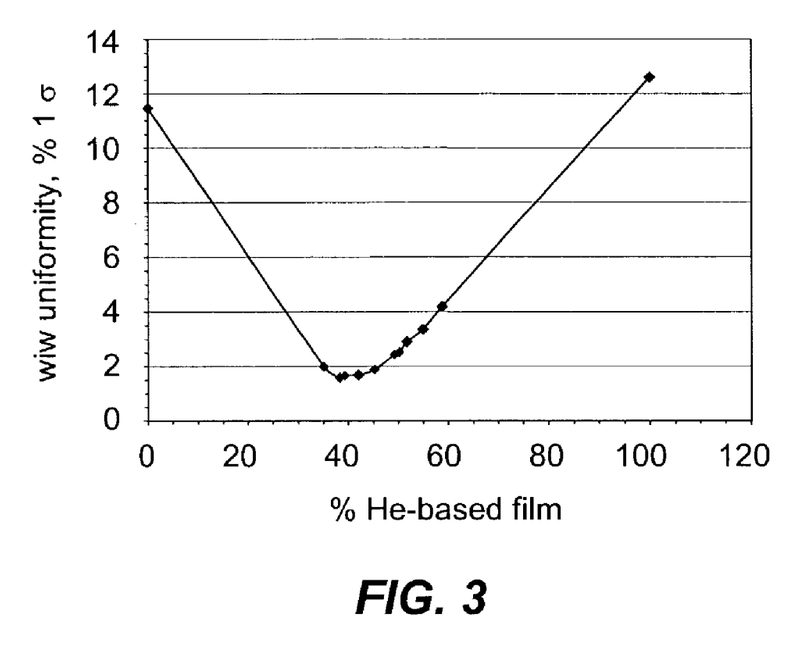
FIG. 3 is a graph of wiw uniformity (% 1σ) vs. % He-process based film at a low deposition rate of about 1300 Å/min.
Figure 4A:
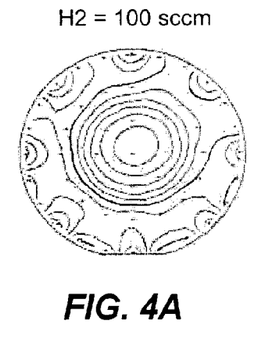
FIGS. 4A–G depict a series of deposition maps showing deposition profiles of HDP CVD films deposited with increasing $H_2$ content in the reactive mixture.
Figure 4B:
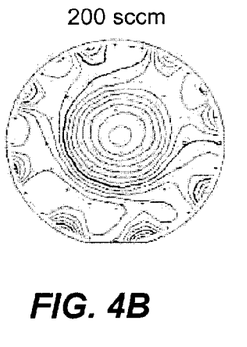
Figure 4C:
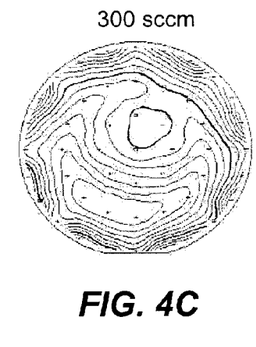
Figure 4D:
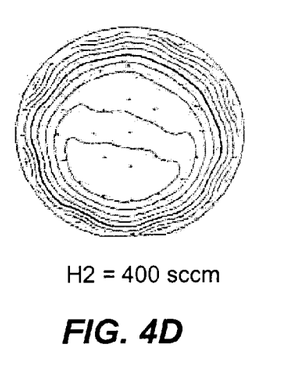
Figure 4E:
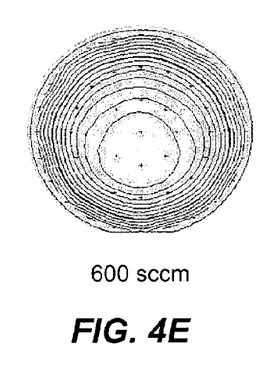
Figure 4F:
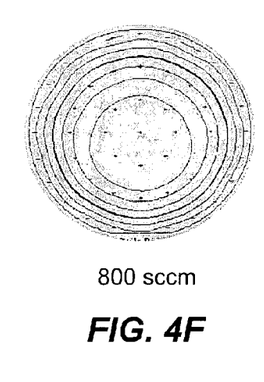
Figure 4G:
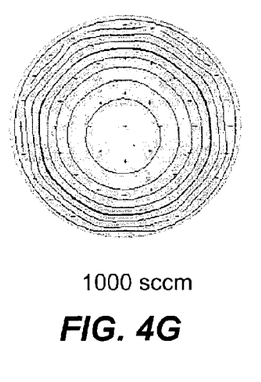

Superposition of the two layers yields a stack of optimized uniformity. FIG. 3 is a graph of wiw uniformity (% 1σ) vs. % He-process based film at a low deposition rate of about 1300 Å/min, such as may be used in gap-fill applications. The plotted data demonstrates that optimum uniformity is achieved for near equal amounts of He- and H-process based deposition in the film. The present invention is capable of achieving deposition of composite films with wiw uniformity of less than 1.5% 1σ, and even of less than 1% 1σ.

Such composite films also show uniform SD ratio across a wafer. SD ratio refers to the sputter/deposition ratio. It is obtained by measuring the deposition rate for a given dielectric deposition process and then measuring the sputter rate for that same process performed without the silicon-containing precursor (e.g., silane). The SD ratio is given by the following expression:

$$SD = \text{sputter rate}/(\text{sputter rate} + \text{deposition rate})$$

The presence of hydrogen in the process chemistry has been shown to reduce the relative amount of side-wall deposition in gap-fill applications. As a result, gas mixtures containing $H_2$ can fill high aspect ratio ILD or STI structures without incidence of voids and/or weak spots. The preferred process involves starting with a relatively rich hydrogen chemistry, followed by a leaner hydrogen chemistry and/or He-based chemistry. In this way, gap-fill at the bottom of the trench is carried out using hydrogen chemistry, while the less demanding top portion of the structure is carried out using He chemistry. In another embodiment, the subsequent steps of the process may be carried out at a faster deposition rate. Thus, this technique combines the benefits of void free fill, uniform deposition profile and fastest available deposition rate consistent with these goals.

Another approach in controlling the deposition profile of an HDP CVD deposited dielectric in accordance with the present invention involves the use of a mixture of inert and hydrogen carrier gases. Rather than a combination of complementary layers produced in discrete sequential deposition stages by process gases having different amounts of hydrogen, as described above, the hydrogen content of process gases in the reaction chamber, and the resulting dielectric film profile, may be changed gradually rather than in discrete stages. In this way, the process gases used to produce the dielectric film will include gases containing a mixture of an inert carrier, typically helium, and hydrogen.

FIGS. 4A–G depict a series of deposition maps showing deposition profiles of HDP CVD films deposited with increasing $H_2$ content in the reactive mixture. The maps bear contour lines indicating the deposition profile. The hydrogen flow in the process gas was 100, 200, 300, 400, 600, 800 and 1000 sccm to produce the profiles shown in FIGS. 4A–G, respectively. The remaining chemistry and deposition conditions used are as follows:

| | |
|---|---|
| $SiH_4$ | 45 sccm |
| $O_2$ | 65 sccm |
| Ar | 0 sccm |
| He | 0 sccm |
| LF Power | 4000 Watts |
| HF Power | 2800 Watts |

The deposition maps shown that for a low hydrogen flow the profile is center-thin, becoming increasingly center-thick as the hydrogen content increases. Thus, the deposition profile may also be controlled by a gradual change in hydrogen flow.

Figure 5:
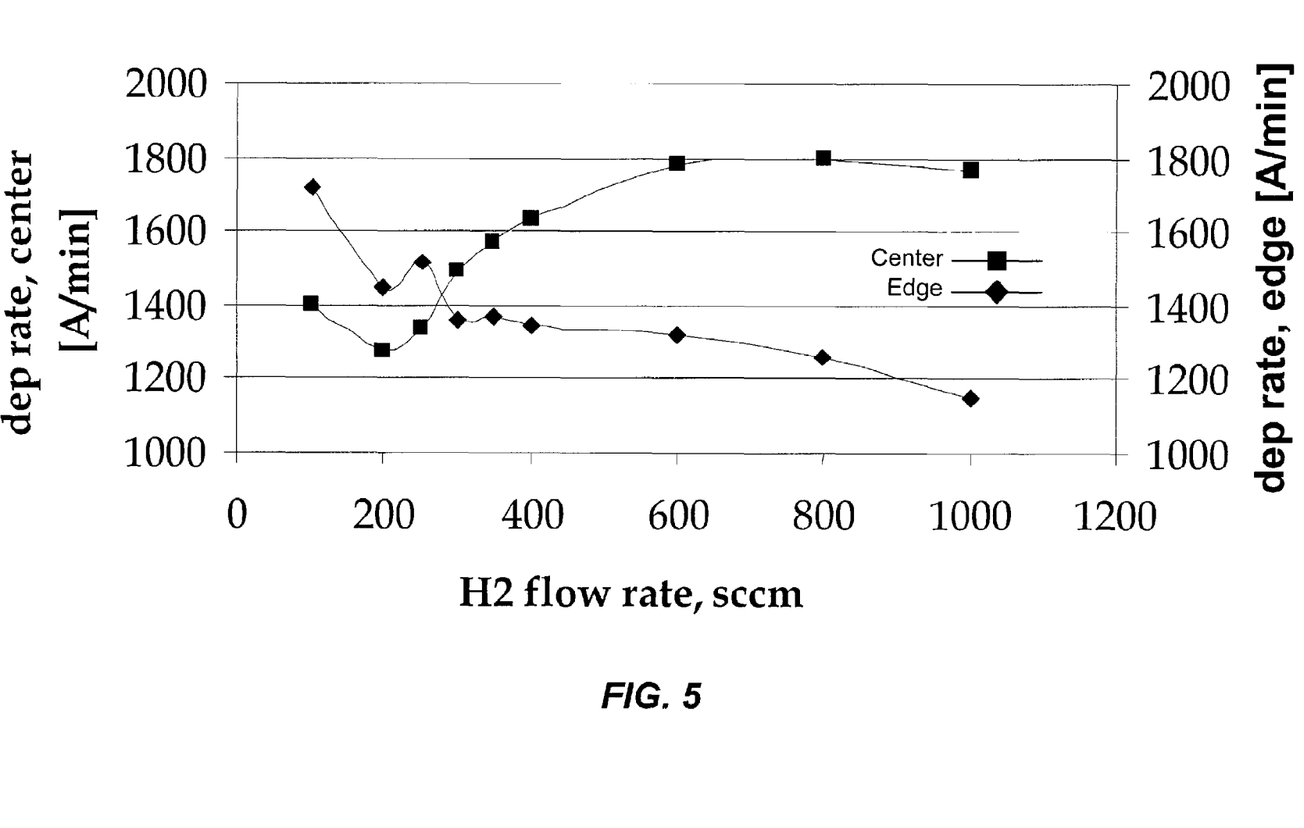
FIG. 5 is a graph of deposition rate (at wafer center and edge) vs. $H_2$ flow rate showing local deposition rate on the wafer as a function of hydrogen content in the reactive mixture for the data mapped in FIGS. 4A–G.

FIG. 5 is a graph of deposition rate (at wafer center and edge) vs. $H_2$ flow rate showing local deposition rate on the wafer as a function of hydrogen content in the reactive mixture for the data mapped in FIGS. 4A–G. The plot illustrates that the deposition rate at the center of the wafer increases with hydrogen content up to 600 to 1000 sccm and that the deposition rate at the wafer edge decreases with increasing hydrogen content.

In applications where a blanket layer of dielectric is to be deposited, the process gas initially supplied to the HDP CVD reaction chamber may have any amount of hydrogen suitable for dielectric deposition, and the hydrogen flow can be either increased or decreased to obtain the desired profile. Often, the desired profile will be the one with the best wiw uniformity. Alternatively, the approach can be used to modify the deposition profile of films making them compatible with subsequent processes such as CMP. For example, a center thick dielectric may be deposited in advance of CMP.

In gap-fill applications, the initial process gas may have a high hydrogen content in order to take advantage of the superior high aspect ratio gap-fill capability of $H_2$-based HDP CVD processing. As the gap is filled and the A/R decreases, the hydrogen flow can be gradually decreased to complete the fill with low $H_2$- or pure He-based chemistry at higher deposition rates.

Figure 6:
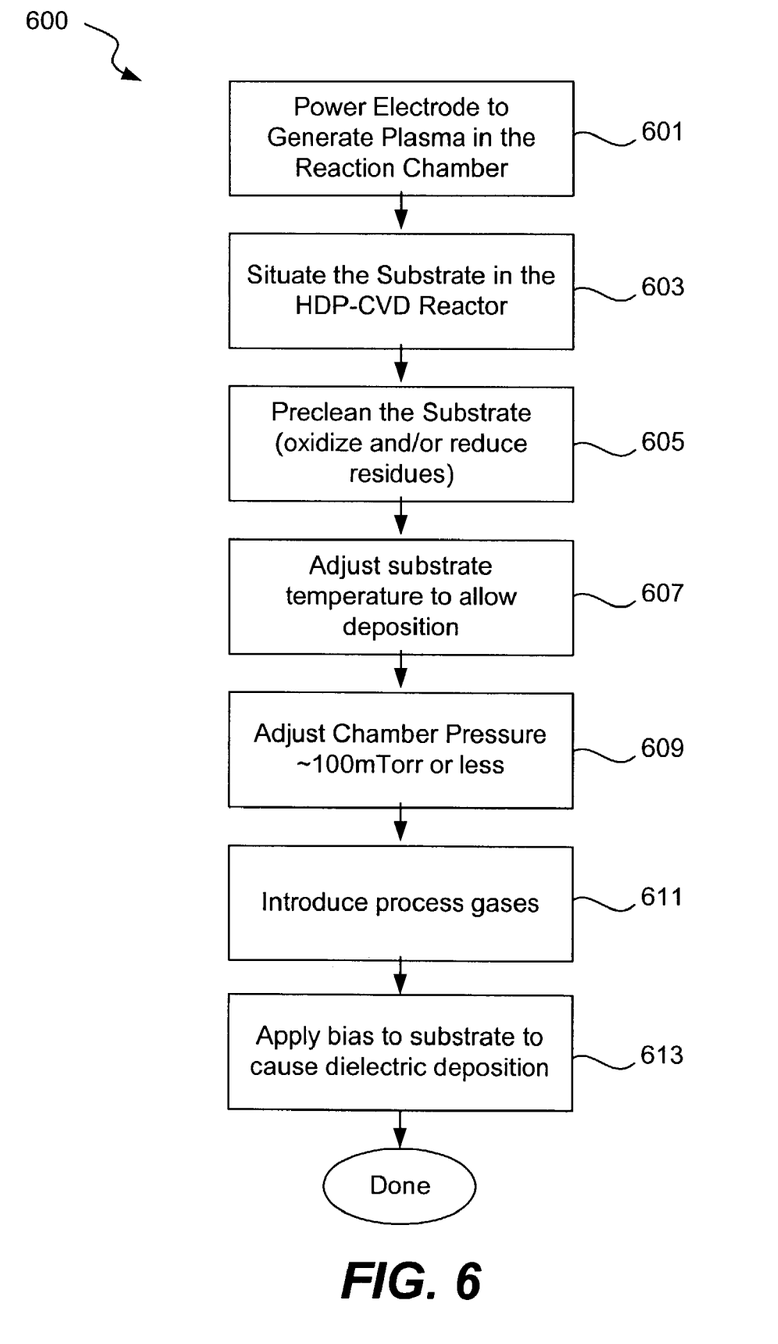
FIG. 6 is a process flow diagram depicting a process context of the present invention.

A general process context for the dielectric deposition technology of this invention is depicted in FIG. 6. As shown, a deposition process 600 begins at block 301 with an electrical subsystem applying electrical energy of appropriate power and frequency to one or more electrodes of a process chamber of a high-density plasma chemical vapor deposition reactor. The power and frequency are chosen to generate a high-density plasma in the chamber, given the process gas concentration, pressure, and other process parameters At block 603, a device (often a robot arm) delivers a substrate to the process chamber. Subsequently, the process will deposit dielectric on the substrate. Providing the substrate to the reactor may involve clamping the substrate to a pedestal or other support in the chamber. For this purpose, an electrostatic or mechanical chuck may be employed.

After the wafer is appropriately situated in the chamber, the process provides a preclean operation. See block 605. This is intended to remove polymer or other residues on the wafer prior to the dielectric film growing. Preferably, this is accomplished with a plasma phase reaction of at least one of an oxygen-containing gas and a hydrogen-containing gas. Oxygen is used for species that require oxidation and hydrogen is used for species that require reduction.

After the substrate has been appropriately cleaned, various other operations associated with dielectric deposition are performed. These operations are represented by reference numbers 607, 609, 611 and 613. These operations may be performed sequentially in the order shown or in some other order. In addition, some or all of these operations may be performed concurrently, as they are implemented by different subsystems of the reactor.

In block 607, the process adjusts the substrate temperature to a level promoting the deposition of the dielectric layer. Typically, this temperature is between about 30–1000° C. (more preferably about 300 to 680° C., for example 450–550° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation.

At block 609, the process adjusts the pressure of the process chamber to a level suitable for the HDP CVD reaction. In some specific embodiments, this pressure is not greater than about 100 mTorr. The pressure should allow relatively rapid deposition while maintaining a high density plasma under the applied frequency and power.

At block 611, the reactor system introduces an initial process gas to the reaction chamber via an inlet. The process gas includes dielectric precursor species such as high vapor pressure silicon-containing compounds, and, optionally, one or more dopant precursors. Molecular oxygen or another oxygenated compound will often be present. One or more carrier gases are also present. Importantly, as described above, the introduced process gas may contain molecular or elemental hydrogen as a carrier gas. All the process gas components are introduced at specified flow rates.

At 613, an electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency RF bias and the other electrode is powered by a lower frequency RF source.

After a period of time, which may vary greatly depending upon the particular application of the deposition technology, the process gas chemistry in the reactor chamber is changed. As described above, this process chemistry change may be discrete (e.g., by replacement of the initial process gas with a different one having a different hydrogen content), or the change in process chemistry may be gradual (e.g., by altering the flow rate of hydrogen in the initial process gas).

When the dielectric layer is deposited on the substrate to a desired thickness and profile via the high density plasma chemical vapor deposition, the process is complete. After evacuating the chamber and adjusting the temperature and pressure as appropriate, the substrate may be removed for further processing.

HDP CVD Reactors

Various plasma reactor designs are suitable for use with this invention. The particular design is not critical to this invention. It merely needs to support HDP CVD dielectric layer formation on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes to generate a plasma and a bias source for the substrate. A temperature control system is typically used to heat the substrate.

Figure 7:
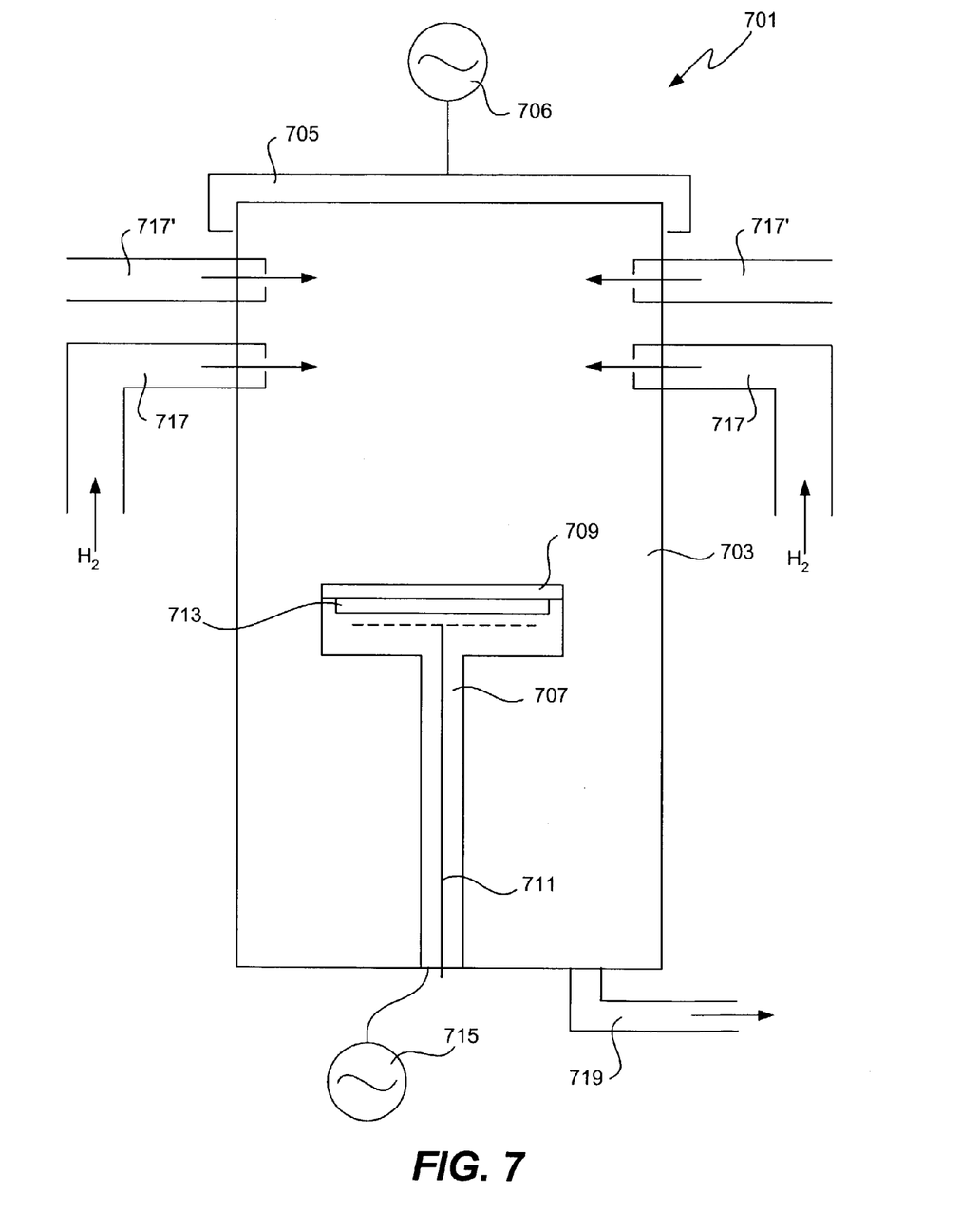
FIG. 7 is a block diagram depicting some components of a suitable CVD reactor for performing HDP CVD in accordance with this invention.

FIG. 7 provides a simple block diagram depicting various reactor components arranged as in a conventional reactor. As shown, a reactor 701 includes a process chamber 703 which encloses other components of the reactor and serves to contain the plasma generated by an electrode 705. In one example, the process chamber walls are made from aluminum, aluminum oxide, and/or other suitable material. Electrode 705 is powered by a "low frequency" rf source 706. The power and frequency supplied by source 706 is sufficient to generate high-density plasma from the process gas.

Within the reactor, a wafer pedestal 707 supports a substrate 709. The pedestal typically includes a chuck to hold the substrate in place during the deposition reaction. The chuck may be an electrostatic chuck, a mechanical chuck or various other types of chuck as are available for use in the industry and/or research.

A heat transfer subsystem including a line 711 for supplying a heat transfer fluid controls the temperature of substrate 709. In some embodiments, the heat transfer fluid comprises at least one of helium and argon gas. The heat transfer fluid is supplied to a space 713 between the surface of the substrate and a surface of the chuck.

A "high frequency" rf source 715 serves to electrically bias substrate 709 and draw charged precursor species onto the substrate for the deposition reaction. Electrical energy from source 715 is coupled to substrate 709 via an electrode or capacitive coupling, for example. Note that the bias applied to the substrate need not be an rf bias. Other frequencies and DC bias may be used as well. In a specific embodiment, source 715 supplies a radio frequency bias to the substrate, and the radio frequency bias is generated by supplying the electrode with at least 0.2 W/cm$^2$ of power.

The process gases are introduced via one or more inlets 717 and 717'. The gases may be premixed or not. A source of elemental hydrogen gas provides hydrogen for the process gas. Other sources of precursor gases and carrier gases may also be provided. Preferably, the process gas is introduced through a gas supply inlet mechanism including orifices. In some embodiments, at least some of the orifices orient the process gas along an axis of injection intersecting an exposed surface of the substrate at an acute angle. Further, the gases or gas mixtures may be introduced from a primary gas ring, which may or may not direct the gases toward the substrate surface. Injectors may be connected to the primary gas ring to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate.

Process gases exit chamber 703 via an outlet 719. A vacuum pump (e.g., a turbomolecular pump) typically draws process gases out and maintains a suitably low pressure within the reactor.

Process Parameters

The process gases used in accordance with the present invention will vary in composition, particularly in terms of their hydrogen composition as described above. Each additional component will be present at a particular level. Typically, the composition is represented by flow rates of the constituent gases in units of standard cubic centimeter per minute (sccm).

In all embodiments of this invention, elemental hydrogen is introduced into the chamber in at least one of the process gases. The process gas will also include a precursor for the deposition layer. If the dielectric is a silicon-containing dielectric, then the process gas will include a silicon-bearing compound such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethyl-silane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

Oxygen to form the silicon oxide or other dielectric material may be provided by the silicon-containing precursor itself or from another process gas such as elemental oxygen ($O_2$), nitric oxide (NO), and/or nitrous oxide ($N_2O$).

Typical flow rate ranges for process gases of the present invention are listed below.

| Gas | Flow Rate (sccm) |
|---|---|
| $SiH_4$ | 10–250 |
| $O_2$ | 10–1000 |
| $H_2$ | 0–1500 |
| He | 0–500 |
| Ar | 0–100 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 125 sccm.

Note also that the presence of hydrogen in the process gas may require that the ratio of oxygen containing precursor to silicon-containing precursor be adjusted upward (in comparison to a standard hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 200 sccm, and more preferably at least about 400 sccm, and most preferably at least about 500 sccm—all based on a 200 millimeter substrate. Larger substrates require higher flow rates. The flow rate may vary somewhat when special injector configurations are employed.

The invention is also practiced with processes gases containing noble gas (e.g., argon, helium, or xenon), with helium being preferred, either as the sole carrier gas, or in a mixture with hydrogen. The use of noble gases can be practiced under the conditions of the above-described embodiments, and their flow rate can be used in order to modulate (i.e., dilute) the hydrogen-based deposition profile modification.

For doped dielectrics (particularly silicon dioxide based dielectrics), the process gas may include a dopant precursor such as a boron-containing gas, a phosphorus-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, NO, $N_2O$, and mixtures thereof.

The method applies as well to the deposition (biased or unbiased) of carbon-doped silicon oxide from process gas mixtures including organosilanes (e.g., TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethyl-silane), TMDSO (tetramethyl-disiloxane), TMDDSO (tetramethyl-diethoxyl-di siloxane), DMDMS (dimethyl-dimethoxyl-silane) and mixtures thereof).

Reactor pressure is held at a value necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 450° C.

As indicated, to control the substrate temperature, the reactor may supply a heat transfer gas between a surface of the substrate and a surface of the substrate holder on which the substrate is supported during film deposition. The heat transfer gas may include at least one of helium and argon.

The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the upper electrode (for generating the plasma) typically varies from 1 kW to 20 kW, and the high frequency power (for biasing the wafer) typically reaches at least about 0.2 W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

Substrates and Dielectric Materials

The above-described processes and apparatuses may deposit dielectric on any type of substrate that requires thin dielectric layers. Often, the substrate will be a semiconductor wafer. The invention is not, however, limited to such applications. It may be employed in a myriad of other fabrication processes such as for fabricating flat panel displays.

As indicated above, this invention finds particular value in integrated circuit fabrication. The dielectric deposition processes are performed on partially fabricated integrated circuits employing semiconductor substrates. In specific examples, the processes of this invention are employed to form blanket dielectric layers, such as inter-metal dielectric layers, passivation layers, etc., and in gap-filling for shallow trench isolation inter-layer dielectric trenches, etc.

The dielectrics employed to fill those gaps will often be a silicon oxide such as silicon dioxide, silicon oxynitride, silicon oxyfluoride, and doped variants of each of these. Therefore, the scope of the invention includes at least fluorine-doped, phosphorus-doped, boron-doped, and boron/phosphorus-doped oxides. As indicated, the dielectric may also be a phosphorus- and boron-doped silicon oxide glass (BPSG).

EXAMPLES

The following examples are provided to further illustrate aspects and advantageous of the present invention. The invention is not limited by these examples.

Example 1

Dielectric Optical Properties

Figure 8:
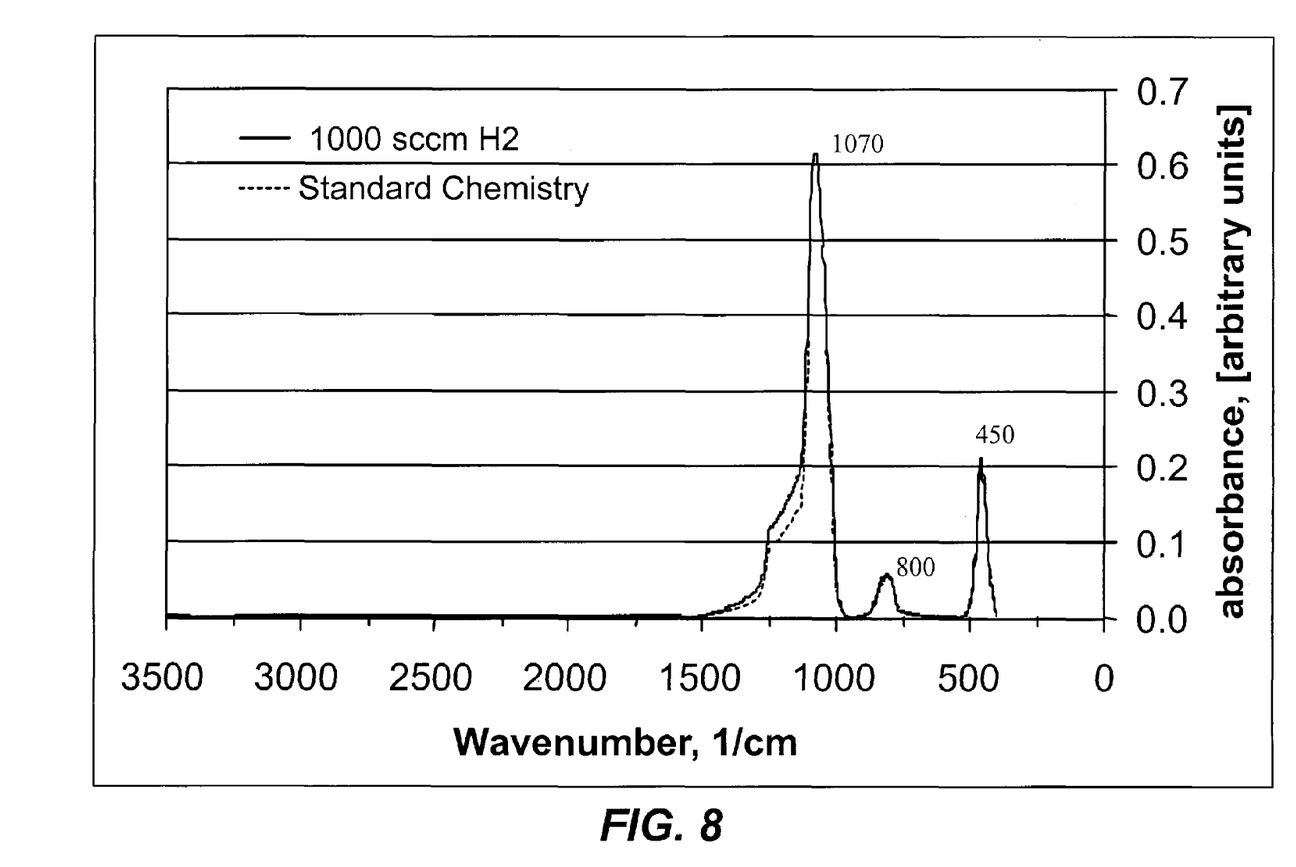
FIG. 8 presents infrared spectral data showing that the properties of a composite dielectric produced in accordance with the present invention are comparable to those of oxides and are within acceptable industry standards.

FIG. 8 shows FTIR absorbance spectra for dielectric films deposited by a standard helium-based HDP CVD process (0 sccm $H_2$ in the process gas) and a hydrogen containing process (1000 sccm $H_2$ in the process gas). Importantly, all of the curves have peaks with almost identical spectral locations and magnitudes. This result indicates that the dielectric formed by a hydrogen-based process in accordance with the present invention has acceptable optical properties relative to the standard dielectric. Also, note the absence of Si—OH and Si—H bonds from the films, as well as the absence of adsorbed $H_2O$.

Example 2

Low wiw Uniformity Film Deposited Via Profile Superposition

Figure 9:
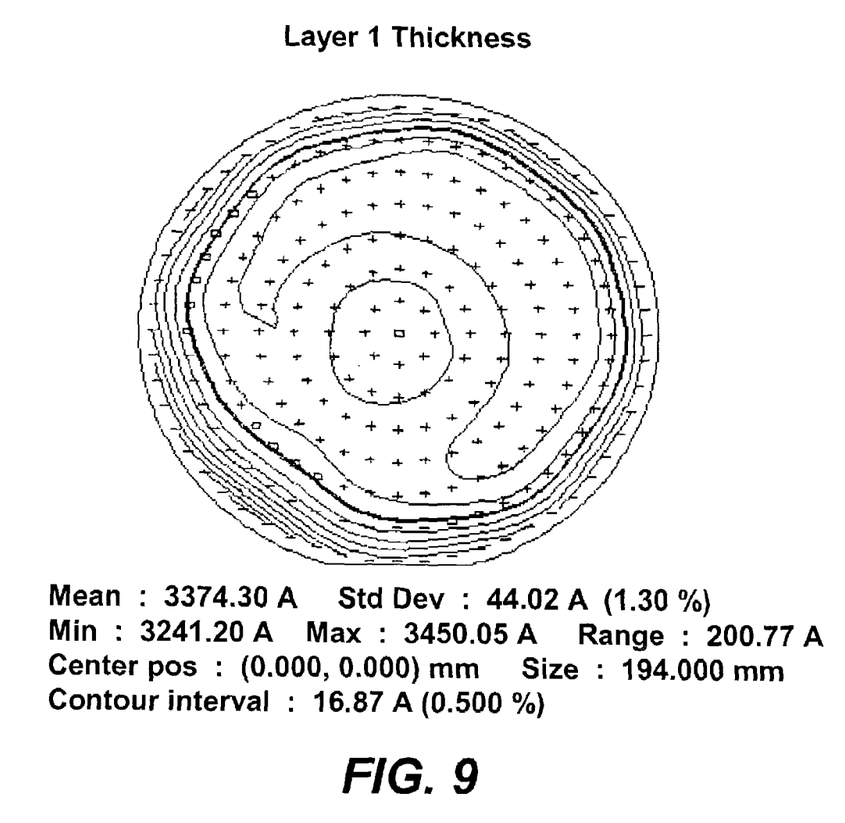
FIG. 9 depicts a deposition map for a dielectric film deposited by profile superposition of complementary film layers.

FIG. 9 depicts a deposition map for a dielectric film deposited by profile superposition of complementary film layers. The maps bear contour lines indicating the deposition profile. The + and − signs indicate greater and less than average thickness, respectively. The film was deposited in two stages using different process conditions. In stage 1, 70% of the film was deposited using a helium-based chemistry and deposition conditions, as follows:

| | |
|---|---|
| $SiH_4$ | 40 sccm |
| $O_2$ | 74 sccm |
| He | 490 sccm |
| $H_2$ | 0 sccm |
| LF Power | 3000 Watts |
| HF Power | 2600 Watts |

In stage 2, 30% of the film was deposited using a hydrogen-based chemistry and deposition conditions, as follows:

| | |
|---|---|
| $SiH_4$ | 40 sccm |
| $O_2$ | 74 sccm |
| $H_2$ | 1200 sccm |
| He | 0 sccm |
| LF Power | 3000 Watts |
| HF Power | 2600 Watts |

The composite film produced by the combined profile superposition of the film layers produced by the helium- and hydrogen-based chemistries had a wiw uniformity of 1.3% 1σ.

Example 3

Low wiw Uniformity Film Deposited Via $H_2$ Addition

Figure 10A:
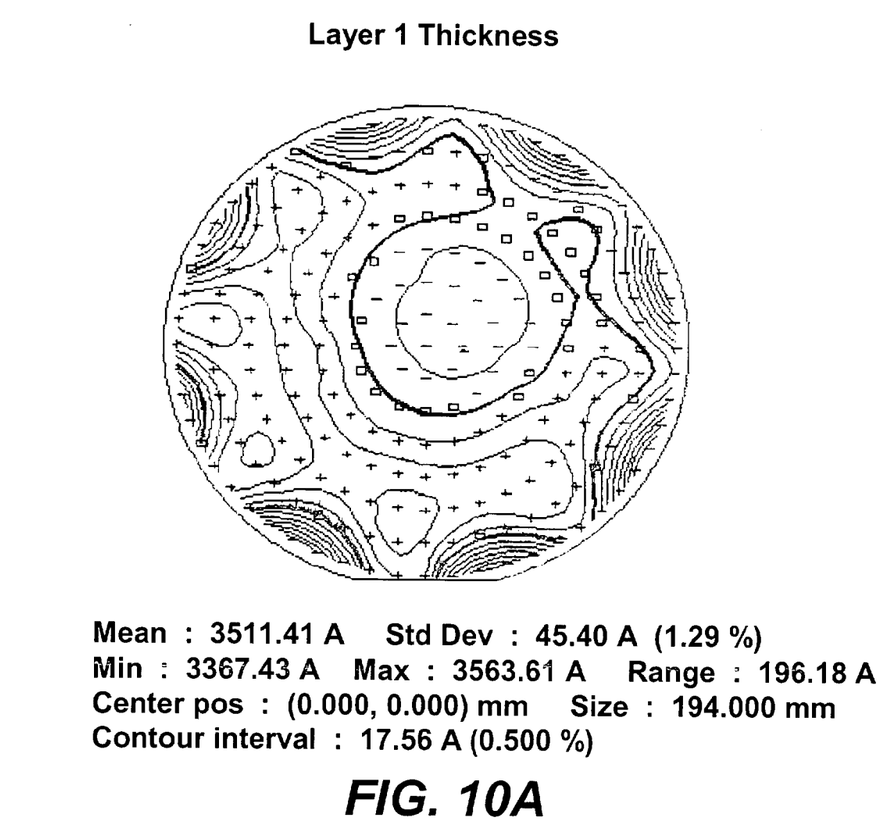
FIG. 10A depicts a deposition map for a dielectric film deposited by gradual addition of hydrogen to a helium-based process chemistry during film deposition.

FIG. 10A depicts a deposition map for a dielectric film deposited by addition of hydrogen to a helium-based process chemistry during film deposition. The maps bear contour lines indicating the deposition profile. The + and − signs indicate greater and less than average thickness, respectively. The starting helium-based chemistry and conditions were as follows:

| | |
|---|---|
| $SiH_4$ | 45 sccm |
| $O_2$ | 56 sccm |
| He | 490 sccm |
| $H_2$ | 0 sccm |
| LF Power | 3200 Watts |
| HF Power | 800 Watts |

Figure 10B:
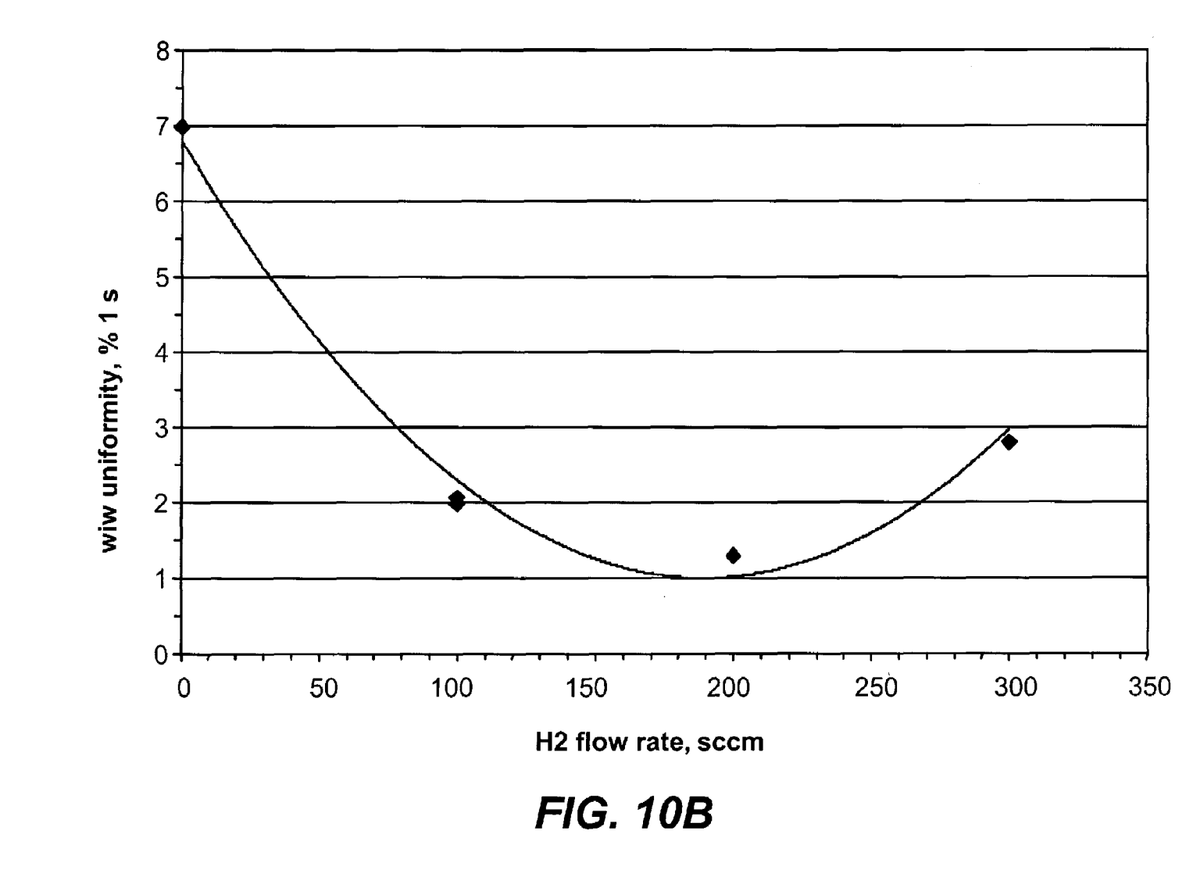
FIG. 10B illustrates a graph of film wiw uniformity vs. $H_2$ flow rate for the process that produced the deposition map illustrated in FIG. 10A.

Hydrogen was gradually added until optimum wiw uniformity was achieved, as illustrated by FIG. 10B. The film produced had a wiw uniformity of about 1.3% 1σ.

While this invention has been described in terms of a few preferred embodiments, it should not be limited to the specifics presented above. Many variations on the above-described preferred embodiments, may be employed. Therefore, the invention should be broadly interpreted with reference to the following claims.

The invention claimed is:

1. A method of depositing a dielectric film on a semiconductor substrate, the method comprising:
    providing a substrate in a process chamber of a high density plasma chemical vapor deposition reactor;
    sequentially introducing into the process chamber a plurality of process gas compositions comprising different $H_2$ contents;
    applying a bias to the substrate, to thereby grow a dielectric film via high density plasma chemical vapor deposition on the semiconductor substrate;
    wherein the deposition profile of the deposited dielectric film is controlled by varying the molecular hydrogen content of the process gas compositions.

2. The method of claim 1, wherein the plurality of process gas compositions comprise from about 0 to 1500 sccm $H_2$.

3. The method of claim 1, wherein the sequential introduction of process gas compositions is done in discrete stages.

4. The method of claim 3, wherein an initial process gas composition comprises $H_2$ as a carrier.

5. The method of claim 4, wherein a subsequent process gas composition comprises only an inert carrier gas.

6. The method of claim 5, wherein the inert carrier gas is helium.

7. The method of claim 3, wherein an initial process gas composition comprises only an inert carrier gas.

8. The method of claim 7, wherein the inert carrier gas is helium.

9. The method of claim 7, wherein a subsequent process gas composition comprises $H_2$ as a carrier.

10. The method of claim 1, wherein the sequential introduction of process gases is done by gradually changing the flow rate of hydrogen entering the process chamber.

11. The method of claim 10, wherein an initial process gas comprises hydrogen as a carrier.

12. The method of claim 4, wherein a subsequent process gas comprises only an inert carrier gas.

13. The method of claim 12, wherein the inert carrier gas is helium.

14. The method of claim 10, wherein an initial process gas comprises only an inert carrier gas.

15. The method of claim 14, wherein the inert carrier gas is helium.

16. The method of claim 7, wherein a subsequent process gas comprises $H_2$ as a carrier.

17. The method of claim 1, wherein the wiw uniformity of the film is less than about 2% 1 sigma.

18. The method of claim 1, wherein the wiw uniformity of the film is less than about 1.5% 1 sigma.

19. The method of claim 1, wherein the wiw uniformity of the film is less than about 1% 1 sigma.

20. The method of claim 1, wherein the film is a blanket layer of dielectric.

21. The method of claim 1, wherein the film is used for a gap-fill operation.

22. The method of claim 1, wherein the deposition profile of the film is adapted to compensate for a subsequent processing procedure.

23. The method of claim 22, wherein the subsequent processing procedure is chemical mechanical polishing, and the deposition profile is center thick.

24. The method of claim 1, wherein the process gas further comprises a silicon-bearing compound selected from the group of $SiH_4$, $SiF_4$, $Si_2H_6$, TEOS, TMCTS, OMCTS, methyl-silane, dimethyl-silane, 3MS, 4MS, TMDSO, TMDDSO, DMDMS and mixtures thereof, said process further comprising decomposing the silicon-containing compound to allow plasma phase reacting of a silicon-containing reactant on the surface of the substrate.

25. The method of claim 24, wherein the process gas further comprises a reactant selected from the group consisting of $N_2$, $N_2O$, NO, $NH_3$, $NF_3$, $O_2$, and mixtures thereof.

26. The method of claim 25, wherein the process gas comprises a reactant selected from the group of boron-containing gas, phosphorus-containing gas, and mixtures thereof.

27. The method of claim 1, wherein the process chamber is maintained at a pressure of not more than about 100 mTorr.

28. The method of claim 1, wherein the high-density plasma chemical vapor deposition reactor comprises an electrode that generates a plasma from the process gas.

29. The method of claim 1, wherein the bias applied to the substrate is a radio frequency bias.

30. The method of claim 29, wherein applying a bias to the substrate comprises supporting the substrate on a substrate holder having an electrode supplying a radio frequency bias to the substrate, the radio frequency bias being generated by supplying the electrode with at least 0.2 W/cm$^2$ of power.

31. The method of claim 29, wherein the radio frequency bias applied to the substrate is at the frequency range of between about 100 kHz and 27 MHz.

32. The method of claim 1, wherein the substrate is placed on a substrate holder that is maintained at a temperature of between about 30 and 1000° C.

33. The method of claim 1, further comprising supplying a heat transfer gas between a surface of the substrate and a surface of the substrate holder on which the substrate is supported during the film growing.

34. The method of claim 33, further comprising clamping the substrate on an electrostatic or mechanical chuck during the film grow.

35. The method of claim 34, wherein the heat transfer gas comprises at least one of helium and argon and is supplied to a space between the surface of the substrate and a surface of the chuck.

36. The method of claim 1, further comprising plasma phase reacting at least one of an oxygen-containing gas and a hydrogen-containing gas on the substrate surface and removing polymer residues from the substrate surface prior to the film growing.

37. The method of claim 1, wherein the dielectric film comprises a silicon oxide.

38. The method of claim 1, wherein the dielectric film comprises $SiO_2$.

39. The method of claim 1, wherein the gases includes silicon and fluorine-containing reactants and the dielectric film comprises silicon oxyfluoride.

40. The method of claim 1, wherein the gases includes nitrogen-containing reactants and the dielectric film comprises silicon oxynitride.

41. The method of claim 1, wherein the gases includes phosphorus-containing reactants and the dielectric film comprises phosphorus-doped silicon oxide.

42. The method of claim 1, wherein the gases include boron-containing reactants and the dielectric film comprises boron-doped silicon oxide.

43. The method of claim 1, wherein the gases include boron-containing reactants and phosphorus-containing reactants and the dielectric film comprises phosphorus- and boron-doped silicon oxide (BPSG).

44. The method of claim 1, wherein the process gases are introduced through gas supply including orifices, at least some of the orifices orienting the process gas along an axis of injection intersecting an exposed surfaced of the substrate at an acute angle.

45. The method of claim 44, wherein introducing the process gases comprise supplying gases or gas mixtures from a primary gas ring, wherein at least some of said gases or gas mixtures are directed toward said substrate.

46. The method of claim 45, wherein injectors are connected to said primary gas ring, the injectors injecting at least some of said gases or gas mixtures into said chamber and directed toward the substrate.

* * * * *